(12) United States Patent
Azuma (10) Patent No.: US 7,884,478 B2
(45) Date of Patent: Feb. 8, 2011

(54) SEMICONDUCTOR APPARATUS

(75) Inventor: Shoji Azuma, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/710,486

(22) Filed: Feb. 26, 2007

(65) Prior Publication Data
US 2007/0200242 A1 Aug. 30, 2007

(30) Foreign Application Priority Data
Feb. 27, 2006 (JP) .............................. 2006-049625

(51) Int. Cl.
*H01L 23/52* (2006.01)
(52) U.S. Cl. .................. 257/758; 257/742; 257/780; 257/782; 257/784; 257/786; 257/E23.002
(58) Field of Classification Search .................. 257/758, 257/774, 784, 780, 782, 786, E23.002
See application file for complete search history.

(56) References Cited

U.S. PATENT DOCUMENTS

| | | | | |
|---|---|---|---|---|
| 4,935,637 | A * | 6/1990 | Kaifu et al. ............... | 250/578.1 |
| 6,329,719 | B1 * | 12/2001 | Nakamura .................. | 257/773 |
| 6,633,087 | B2 * | 10/2003 | Ker et al. ................... | 257/773 |
| 6,779,167 | B2 * | 8/2004 | Igarashi et al. ............. | 716/13 |
| 2006/0063378 | A1 * | 3/2006 | Lin et al. ................... | 438/642 |

FOREIGN PATENT DOCUMENTS

| | | |
|---|---|---|
| JP | 5918041 | 10/1984 |
| JP | 2005-166959 | 6/2005 |

* cited by examiner

*Primary Examiner*—Cuong Q Nguyen
*Assistant Examiner*—Trang Q Tran
(74) *Attorney, Agent, or Firm*—Young & Thompson (57) ABSTRACT

In a semiconductor apparatus having a plurality of wiring layers, the semiconductor apparatus includes a bonding pad formed by an uppermost wiring layer, a first-layer plug wire formed by a first lower wiring layer in a region under the bonding pad, and a first conductive plug connecting the bonding pad and the first-layer plug wire. The first-layer plug wire may include a plurality of first-layer plug wires arranged in parallel to one another in a stripe pattern.

13 Claims, 10 Drawing Sheets

SEMICONDUCTOR APPARATUS

This application claims priority to prior Japanese patent application JP 2006-49625, the disclosure of which is incorporated herein by reference.

BACKGROUND OF THE INVENTION

This invention relates to a semiconductor apparatus and, in particular, to a semiconductor apparatus having a wiring pattern formed in a region under a bonding pad.

Following development of a highly-integrated semiconductor apparatus, a device pattern is more and more miniaturized and a design rule thereof becomes finer year after year. However, in comparison with the progress of miniaturization of the device pattern, the progress in miniaturization of a bonding pad of the semiconductor apparatus is little due to limitation imposed upon a bonding technique and an accuracy of a bonding apparatus. In the semiconductor apparatus, for example, in a dynamic random access memory (DRAM), reduction in chip size has a significant influence upon cost reduction in order that mass production is carried out. In order to reduce the chip size, it is necessary to reduce a bonding pad area and to effectively use a region under the bonding pad area. As one approach for effectively using the bonding pad area, it is considered to form the bonding pad on a device region or a wiring region while the bonding pad is traditionally formed in a region except the device region and the wiring region.

Figure 1:
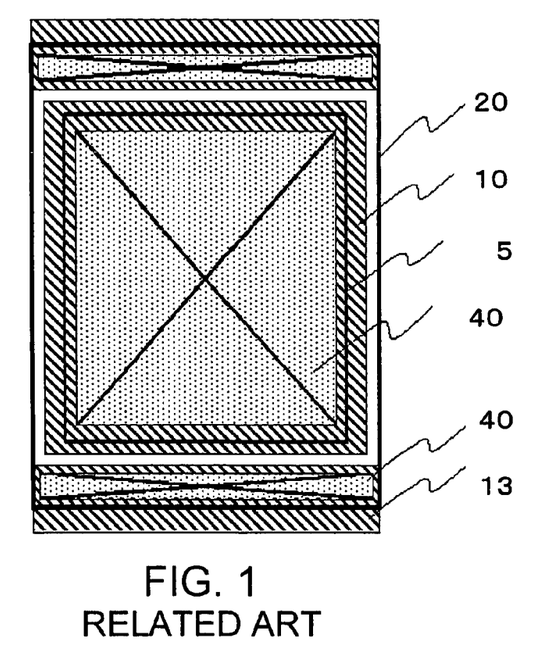
FIG. 1 is a plan view of a related bonding pad using a plug formed throughout an entire area of the bonding pad.

A related bonding pad comprising a two-layer aluminum wiring structure is shown in FIG. 1. In a region under the bonding pad formed by a #2 aluminum pad wiring 20 as an upper wiring layer, a #1 aluminum wiring 10 as a lower wiring layer similar in size to the bonding pad is disposed. At both ends of the bonding pad, #1 aluminum pad connecting wirings 13 as internal wirings and the #2 aluminum pad wiring 20 are connected to each other by #1-#2 layer conductive plugs 40. The #1 aluminum wiring 10 is, throughout a substantially entire area thereof, connected to the #2 aluminum pad wiring 20 via another #1-#2 layer conductive plug 40. The #1-#2 layer conductive plugs 40 serve as piles (or anchor bolts) for preventing the #2 aluminum pad wiring 20 from being peeled off after bonding. With the above-mentioned structure, since the #1 aluminum wiring 10 is present in the region under the bonding pad, the lower wiring layer can not be used as a signal wiring, resulting in an increase in chip size.

In FIG. 1, a polyimide 5 is provided with an opening.

Figure 2:
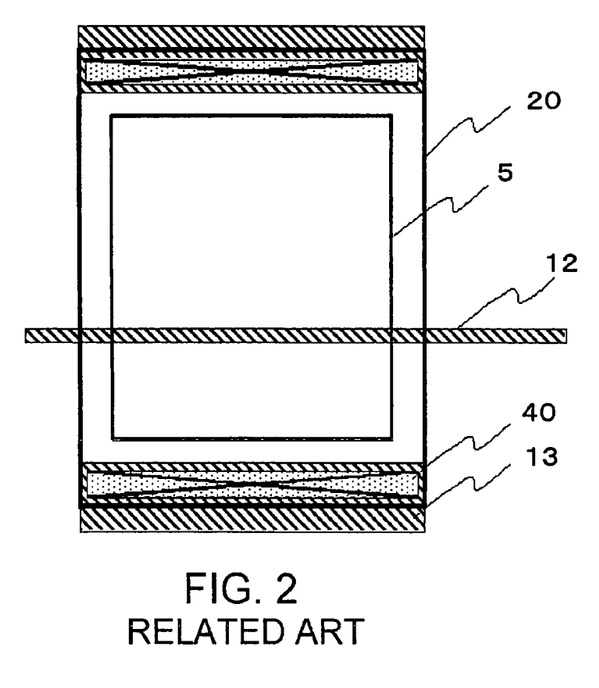
FIG. 2 is a plan view of another related bonding pad with a pass-through wiring.

Referring to FIG. 2, description will be made of a case where the #1 aluminum wiring 10 and the #1-#2 layer conductive plug 40 formed throughout the substantially entire area under the bonding pad are not used. In FIG. 2, instead of the #1 aluminum wiring 10 under the bonding pad in FIG. 1, a #1 aluminum pass-through wiring 12 as a signal wiring can be arranged. Thus, in case where the bonding pad of the #2 aluminum pad wiring 20 is not peeled off from an interlayer insulating film by a mechanical shock during bonding, the #1 aluminum pass-through wiring 12 can be disposed under the bonding pad. However, if the pass-through wiring 12 is extended under the bonding pad, the pass-through wiring 12 may be broken due to the mechanical shock during bonding.

Japanese Unexamined Patent Application Publication JP S59-181041 A discloses such a technique of forming the lower wiring layer in the region under the bonding pad. In the above-mentioned publication, however, the wiring under the bonding pad is limited to a wiring having a large wiring width in order to prevent breakage due to the mechanical shock during bonding. In addition, in the structure disclosed in the above-mentioned publication, the bonding pad of the #2 aluminum wiring is easily peeled off after bonding.

In an etching step or a CMP (Chemical Mechanical Polishing) step, an optimum production condition is different depending upon the density of the pattern. In FIG. 1, a pattern as the lower wiring layer similar in size to the bonding pad is disposed in the region under the bonding pad. Therefore, the pattern is dense as compared with an internal circuit portion. In FIG. 2, depending upon the number of wirings extended in the region under the bonding pad, the pattern may be sparse as compared with the internal circuit portion. Therefore, the density of the lower wiring pattern under the bonding pad in FIG. 1 or 2 is considerably different as compared with that of the internal circuit portion. This results in a difficulty in determining etching or CMP conditions during a diffusion process.

Another approach for effectively using the bonding pad area is disclosed in Japanese Unexamined Patent Application Publication JP 2005-166959 A. Specifically, a gate region under the bonding pad is protected by a strengthening via. In Japanese Unexamined Patent Application Publication JP 2005-116788 A, a via is formed in order to relax a stress of an insulating film under the bonding pad. However, these publications do not disclose a technique of arranging a fine wiring in the region under the bonding pad. Further, no disclosure is made of a technique of arranging a striped plug wiring in the region under the bonding pad and providing a conductive plug on the plug wiring in order to achieve a density same as that in the internal circuit portion.

As described above, in the semiconductor apparatus, it is desired to reduce the chip size for the purpose of cost reduction. In order to reduce the chip size, it is effective to utilize the region under the bonding pad. Accordingly, it is desired to develop a technique of arranging a fine wiring in the region under the bonding pad so as to effectively use the region under the bonding pad. However, because the pad wiring is peeled off or the pass-through wiring is broken due to the mechanical shock during bonding, it is impossible to arrange the fine pass-through wiring in the region under the bonding pad. Therefore, it is impossible to effectively utilize the region under the bonding pad.

SUMMARY OF THE INVENTION

It is therefore an object of this invention to provide a semiconductor apparatus having a bonding pad which is capable of preventing a wiring from being peeled off or broken due to a mechanical shock during bonding and which allows a fine pass-through wiring to be arranged under the bonding pad.

Semiconductor apparatuses according to this invention are as follows:

(1) A semiconductor apparatus having a plurality of wiring layers, the semiconductor apparatus comprising a bonding pad formed by an uppermost wiring layer, a first-layer plug wire formed by a first lower wiring layer in a region under the bonding pad, and a first conductive plug connecting the bonding pad and the first-layer plug wire.

(2) The semiconductor apparatus according to the paragraph (1), wherein the first-layer plug wire comprises a plurality of first-layer plug wires arranged in parallel to one another in a stripe pattern.

(3) The semiconductor apparatus according to the paragraph (1), wherein the first conductive plug is made of a conductive material harder than aluminum.

(4) The semiconductor apparatus according to the paragraph (3), wherein the conductive material includes tungsten.

(5) The semiconductor apparatus according to the paragraph (2), further comprising first-layer pass-through wires arranged between adjacent ones of the plurality of first-layer plug wires and in parallel to the plurality of first-layer plug wires.

(6) The semiconductor apparatus according to the paragraph (2), the plurality of first-layer plug wires arranged in the region under the bonding pad has a pattern rate not smaller than 20% and not greater than 50%.

(7) The semiconductor apparatus according to the paragraph (5), wherein the plurality of first-layer plug wires and the first-layer pass-through wires in the region under the bonding pad have a total pattern rate not smaller than 20% and not greater than 60%.

(8) The semiconductor apparatus according to the paragraph (1), further comprising a second-layer plug wire formed by a second lower wiring layer under the first lower wiring layer, and a second conductive plug connecting the first-layer plug wire and the second-layer plug wire.

(9) The semiconductor apparatus according to the paragraph (8), wherein the first and the second conductive plugs are formed at the same position in plan view to overlap each other.

(10) The semiconductor apparatus according to the paragraph (8), wherein the first-layer plug wire comprises a plurality of first-layer plug wires arranged in parallel to one another in a stripe pattern, the second-layer plug wire comprising a plurality of second-layer plug wires arranged in a stripe pattern to be orthogonal to the plurality of first-layer plug wires.

(11) The semiconductor apparatus according to the paragraph (10), further comprising first-layer pass-through wires arranged between adjacent ones of the plurality of first-layer plug wires, and second-layer pass-through wires arranged between adjacent ones of the plurality of second-layer plug wires, the first-layer pass-through wires being connected to the second-layer pass-through wires.

In this invention, the striped plug wiring is arranged in the region under the bonding pad. The plug wiring and the pad wiring are connected to each other by the conductive plug.

The plug wiring as a lower layer and the pad wiring as an upper layer are connected by the conductive plug. The conductive plug serves as a pile for preventing the bonding pad from being easily peeled off. Therefore, it is possible to prevent the pad wiring from being peeled off. Since a mechanical shock during bonding is absorbed by the conductive plug, it is possible to prevent breakage of a thin wiring under the bonding pad. Furthermore, a pattern rate is assured by the plug wiring. As the density of a pattern is approximate to the pattern rate of an internal circuit portion, it is easy to determine etching and CMP (Chemical Mechanical Polishing) conditions and so on in a diffusion process. The wiring of a fine pattern equivalent in fineness to the internal circuit portion can be used as a pass-through wiring under the bonding pad. In addition, a diffusion yield is improved.

DESCRIPTION OF THE PREFERRED EMBODIMENTS

Now, description will be made of embodiments of this invention with reference to the drawing.

First Embodiment

Referring to FIGS. 3 to 12, a first embodiment of this invention will be described in detail.

Figure 3:
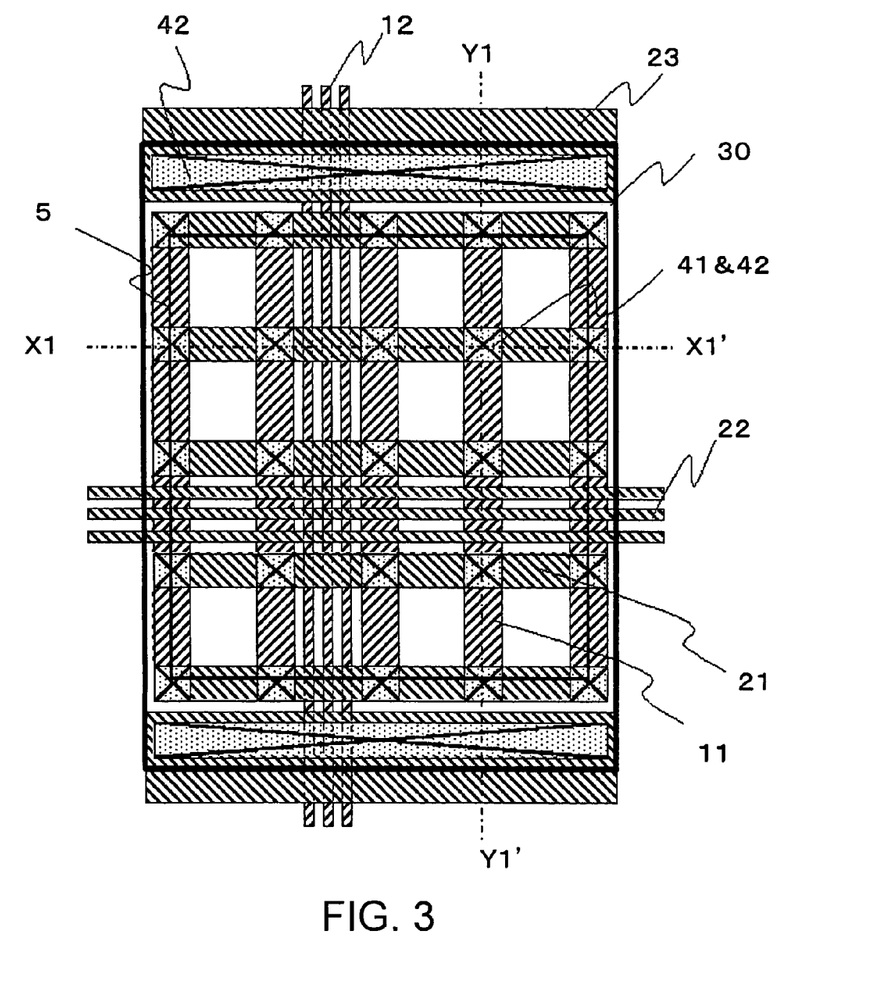
FIG. 3 is a plan view for describing a bonding pad in a first embodiment of this invention.
Figure 4:
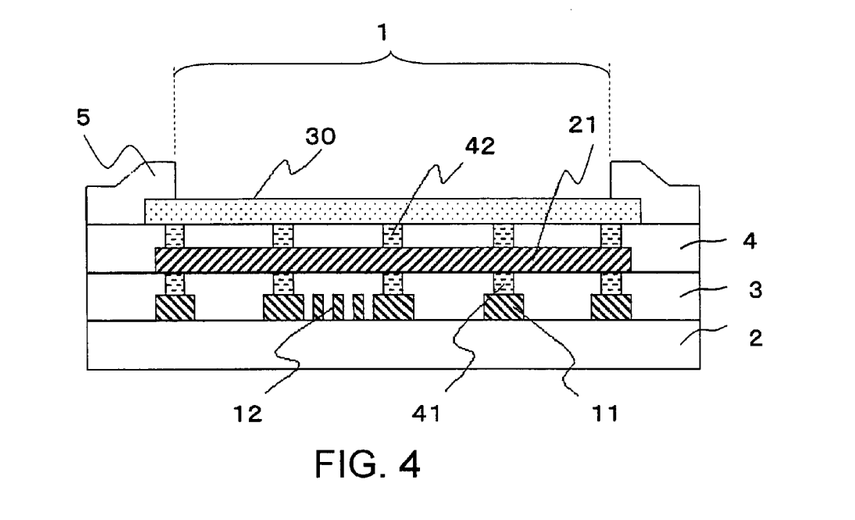
FIG. 4 is a sectional view taken along a line 4-4 in FIG. 3.
Figure 5:
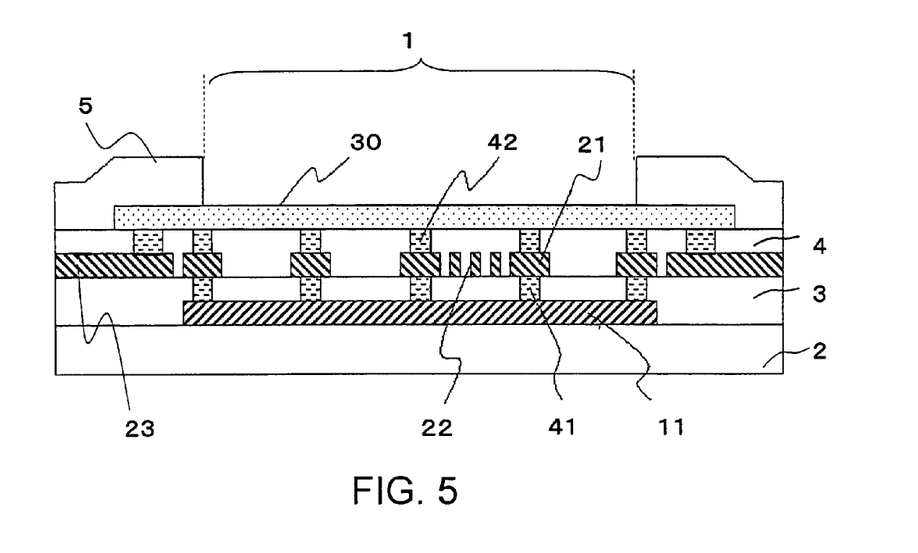
FIG. 5 is a sectional view taken along a line 5-5 in FIG. 3.

Referring to FIGS. 3 through 5, a bonding pad in the first embodiment will be described. In this embodiment, a three-layer aluminum product is described by way of example. The bonding pad comprises a #3 aluminum wiring layer as an uppermost wiring layer, a #2 aluminum wiring layer, and a #1 aluminum wiring layer as a lowermost wiring layer. The #1 aluminum wiring layer has #1 aluminum plug wires 11 and #1 aluminum pass-through wires 12 both of which extend in a Y direction. The #2 aluminum wiring layer has #2 aluminum plug wires 21, #2 aluminum pass-through wires 22, and #2 aluminum pad connection wires 23, all of which extend in an X direction. The #3 aluminum wiring layer has a #3 aluminum pad wire 30 to become the bonding pad.

The #1 aluminum plug wires 11 and the #2 aluminum plug wires 21 are connected by #1-#2 layer conductive plugs 41. The #2 aluminum plug wires 21 and the #3 aluminum pad wire 30 are connected by #2-#3 layer conductive plugs 42. The #1-#2 layer conductive plugs 41 and the #2-#3 layer conductive plugs 42 are formed on substantially same positions in plan view and overlap each other. The conductive plugs 41 and 42 serve as piles to prevent the #3 aluminum pad wire 30 from being peeled off during bonding and to protect the #1 aluminum pass-through wires 12 and the #2 aluminum pass-through wires 22.

On an upper surface of a first interlayer insulating film 2, the #1 aluminum plug wires 11 and the #1 aluminum pass-through wires 12 are patterned as a #1 aluminum pattern. The #1 aluminum plug wires 11 are aluminum wires for forming the conductive plugs. The #1 aluminum pass-through wires 12 pass through a region under the bonding pad and are connected to internal circuits. Further, a second interlayer insulating film 3 is deposited. The second interlayer insulating film 3 is provided with the #1-#2 layer conductive plugs 41 connecting the #1 aluminum plug wires 11 and the #2 aluminum plug wires 21. On an upper surface of the second interlayer insulating film 3, the #2 aluminum plug wires 21, the #2 aluminum pass-through wires 22, and the #2 aluminum pad connection wires 23 are patterned as a #2 aluminum pattern. The #2 aluminum plug wires 21 are aluminum wires for forming the conductive plugs. The #2 aluminum plug wires 22 pass through the region under the bonding pad and are connected to the internal circuits. The #2 aluminum pad connection wires 23 serve to connect signals from the bonding pad to the internal circuits.

Further, a third interlayer insulating film 4 is deposited. The third interlayer insulating film 4 is provided with the #2-#3 layer conductive plugs 42 connecting the #2 aluminum plug wires 21 and the #3 aluminum pad wire 30. On an upper surface of the interlayer insulating film 4, the #3 aluminum pad wire 30 is patterned as a #3 aluminum pattern. On the #3 aluminum pad wire 30, a polyimide 5 is applied. The polyimide 5 on the #3 aluminum pad wire 30 is provided with an opening portion to serve as the bonding pad 1. The bonding pad 1 basically is an area of the #3 aluminum pad wire 30 corresponding to the opening portion formed in the polyimide 5. However, the bonding pad 1 also represents a region including related wires substantially similar in size, such as an outer shape of the #1 aluminum plug wires and the #2 aluminum plug wires or a whole of the #3 aluminum pad wire 30.

In a bonding pad region, the #1 aluminum plug wires 11 and the #2 aluminum plug wires 21 are patterned in a stripe fashion and extend in the Y direction and the X direction, respectively, to be orthogonal to each other. At intersection points of the #1 aluminum plug wires 11 and the #2 aluminum plug wires 21, the #1 aluminum plug wires 11 and the #2 aluminum plug wires 21 are connected to each other by the #2-#3 layer conductive plugs 41. Further, at the intersection points of the #2 aluminum plug wires 21 and the #3 aluminum pad wire 30, the #2 aluminum plug wires 21 and the #3 aluminum pad wire 30 are connected to each other by the #2-#3 layer conductive plugs 42. The #1-#2 layer conductive plugs 41 and the #2-#3 layer conductive plugs 42 are formed at substantially same positions in plan view and overlap each other. Although the #2 aluminum layer is interposed therebetween, these plugs serve as a single plug. By such overlapping arrangement, the function as the pile is more effective. The area (or size) and the number of the conductive plugs are selected so as to prevent peeling of the bonding pad and breakage of the pass-through wires.

Generally, tungsten is used as a material of the conductive plugs. Tungsten is harder than aluminum so that a mechanical shock from upside during bonding is absorbed by the conductive plugs. Therefore, even if the #1 aluminum pass-through wires 12 and the #2 aluminum pass-through wires 22 which are thin wires are arranged through a space between the #1 aluminum plug wires 11 and the #2 aluminum plug wires 21, the #1 aluminum pass-through wires 12 and the #2 aluminum pass-through wires 22 are not broken under the mechanical shock during bonding. The material of the conductive plugs is not specifically limited and any material harder than aluminum (for example, having a high Young's modulus), including tungsten, may be used. Further, an alloy comprising a plurality of kinds of such materials or a laminated structure comprising a plurality of layers of such materials may be used.

The #1 aluminum plug wires 11 and the #2 aluminum plug wires 21 arranged in an area slightly wider than the area of the bonding pad 1 corresponding to the opening portion formed in the polyimide 5. Herein, the #1 aluminum plug wires 11, five in number, are disposed in a stripe pattern. Likewise, the #2 aluminum plug wires 21, five in number, are disposed in a stripe pattern. By presence of the #1 aluminum plug wires and the #2 aluminum plug wires 21, the pattern rates of the #1 aluminum layer and the #2 aluminum layer can be optimized. In the related bonding pad in FIG. 1 or 2, a solid pattern or a substantial no pattern is formed in the region under the bonding pad. On the other hand, in this embodiment, the pattern has a density similar to that of an internal circuit portion by presence of the #1 aluminum plug wires 11, the #2 aluminum plug wires 21, the #1 aluminum pass-through wires 12, and the #2 aluminum pass-through wires 22. Therefore, it is easy to determine etching and CMP conditions in a diffusion process. Since the optimum conditions are obtained, a diffusion yield is improved.

Next, description will be made of a case where this embodiment is applied to an actual semiconductor apparatus. Herein, a DRAM chip of a center bonding type is described as the semiconductor apparatus. The DRAM chip of a center bonding type illustrated in FIG. 6 comprises four memory cell portions 6 disposed upper left, upper right, lower left, and lower right, respectively. At a center portion between the upper and the lower memory cell portions 6, a plurality of the bonding pads 1 are arranged in a single row. Signals from the respective bonding pads 1 are connected to the memory cell portions 6 by the use of a space in the center portion. A layout width (H) of a region including the bonding pads is often determined by the limit number of signal lines (or wires) extending in a longitudinal direction of the chip. In this invention, wires to be generally extended in a signal line region other than the bonding pad region can be extended in the bonding pad region. Therefore, it is possible to reduce the layout width (H) which has been determined by the limit number of the signal lines extending in the longitudinal direction of the chip. Thus, it is possible to reduce the chip size.

Figure 7:
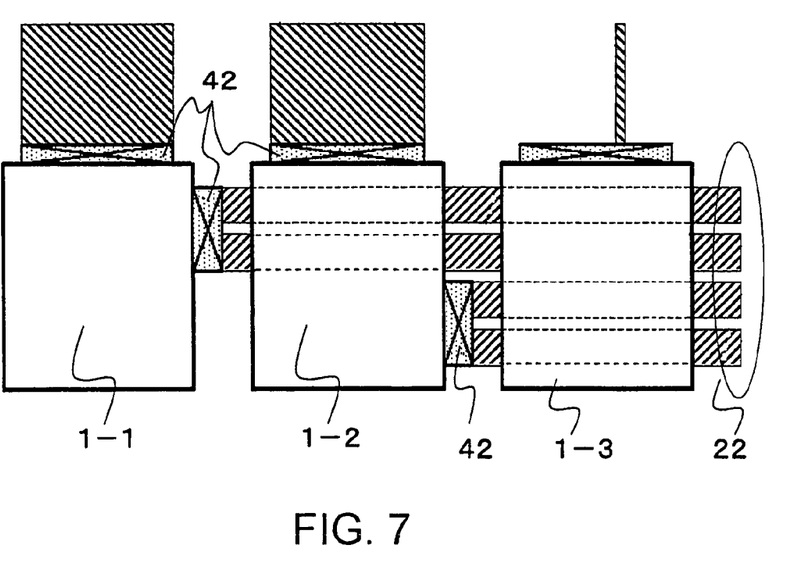
FIG. 7 is a view showing wires passing through a region under the bonding pad in an X direction.

For example, it is possible to lay a power supply line under the bonding pad as illustrated in FIG. 7. If it is desired to extract two power supply lines from a power supply pad, it is possible to connect a power supply for a reference circuit and a power supply for an ordinary circuit through different power supply lines, respectively. In FIG. 7, three bonding pads are shown as a VDD pad 1-1, a GND pad 1-2, and a signal pad 1-3. From each of the VDD pad 1-1 and the GND pad 1-2, a power supply line is extended in the Y direction in the figure as a power supply line for the ordinary circuit. From each of the VDD pad 1-1 and the GND pad 1-2, two power supply lines are extended in the X direction in the figure as power supply lines for the reference circuit.

A special power supply for feeding the reference circuit requiring a stable power supply with less fluctuation can be extracted through the region under the bonding pad to a position near a region where the reference circuit is disposed. Therefore, it is possible to reserve a region for signal lines correspondingly. This structure is effective in reducing the chip size. In FIG. 7, for simplicity of illustration, the #1 aluminum plug wires 11, #2 aluminum plug wires 21, the #1-#2 layer conductive plugs 41, and the #2-#3 layer conductive plugs 42 are not illustrated. Hereinafter, illustration of the aluminum plug wires and the layer conductive plugs may similarly be omitted.

Figure 8:
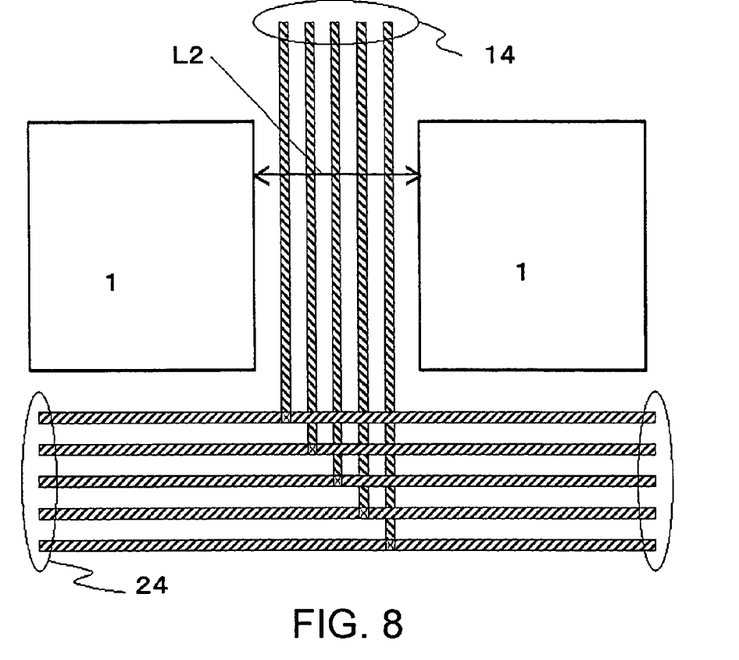
FIG. 8 is a view showing wires passing through a space between the bonding pads in a Y direction.
Figure 9:
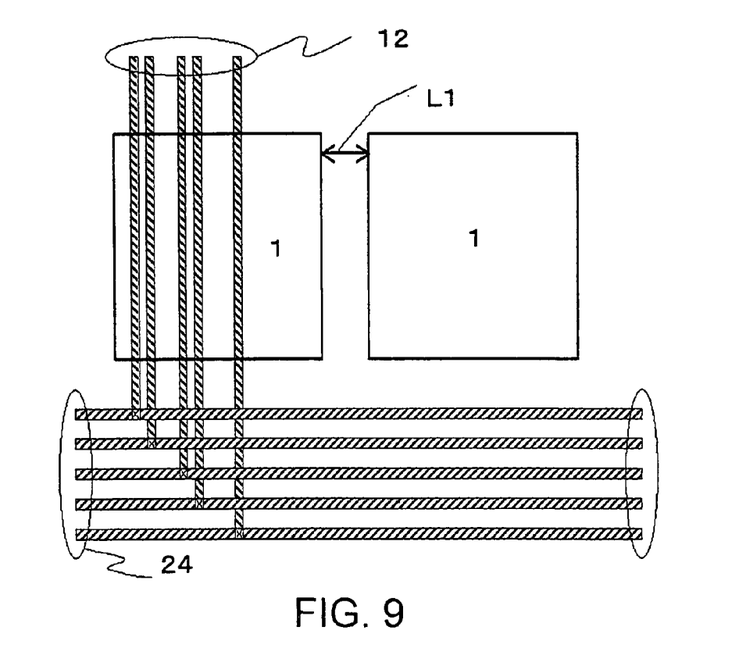
FIG. 9 is a view showing wires passing through the region under the bonding pad in the Y direction.
Figure 10:
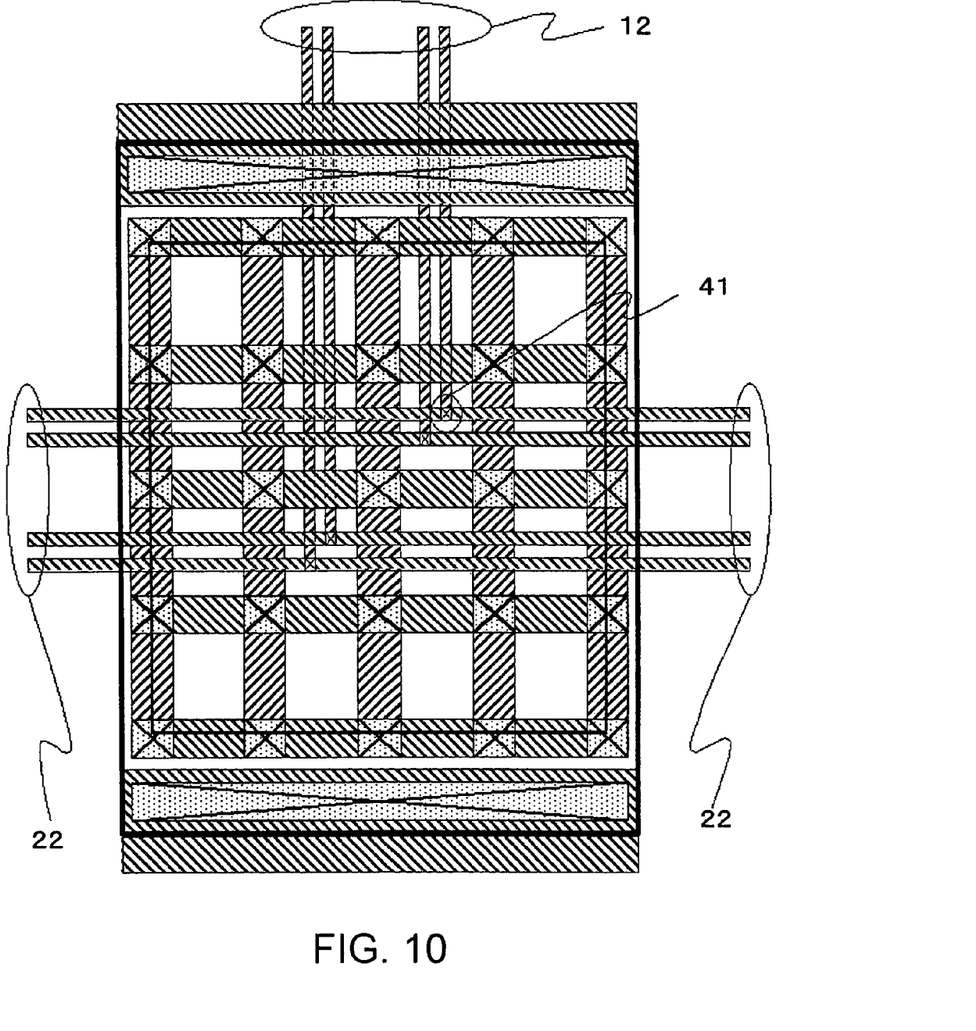
FIG. 10 is a view showing connection between pass-through wires in the X direction and the Y direction under the bonding pad.

Description will be made of a case where signal lines or power supply lines must be laid between the bonding pad regions. Referring to FIG. 8, in a conventional related bonding pad, a pad pitch must be widened to a pitch L2 to reserve a signal line region. This results in an increase in chip size. On the other hand, in a bonding pad structure of this invention, signal lines or power supply lines can be laid in the region under the bonding pad as illustrated in FIG. 9. Therefore, a number of wires or a thick power supply line can be laid without widening the pitch L1 of the bonding pads. Thus, this invention is effective in reducing the chip size in the longitudinal direction. In the bonding pad structure of this invention, as shown in FIG. 10, the #1 aluminum pass-through wires 12 and the #2 aluminum pass-through wires 22 as vertical and horizontal wires of a lower wiring layer passing through the region under the bonding pad can be connected via the #1-#2 layer conductive plugs 41 in the bonding pad region.

Figure 11:
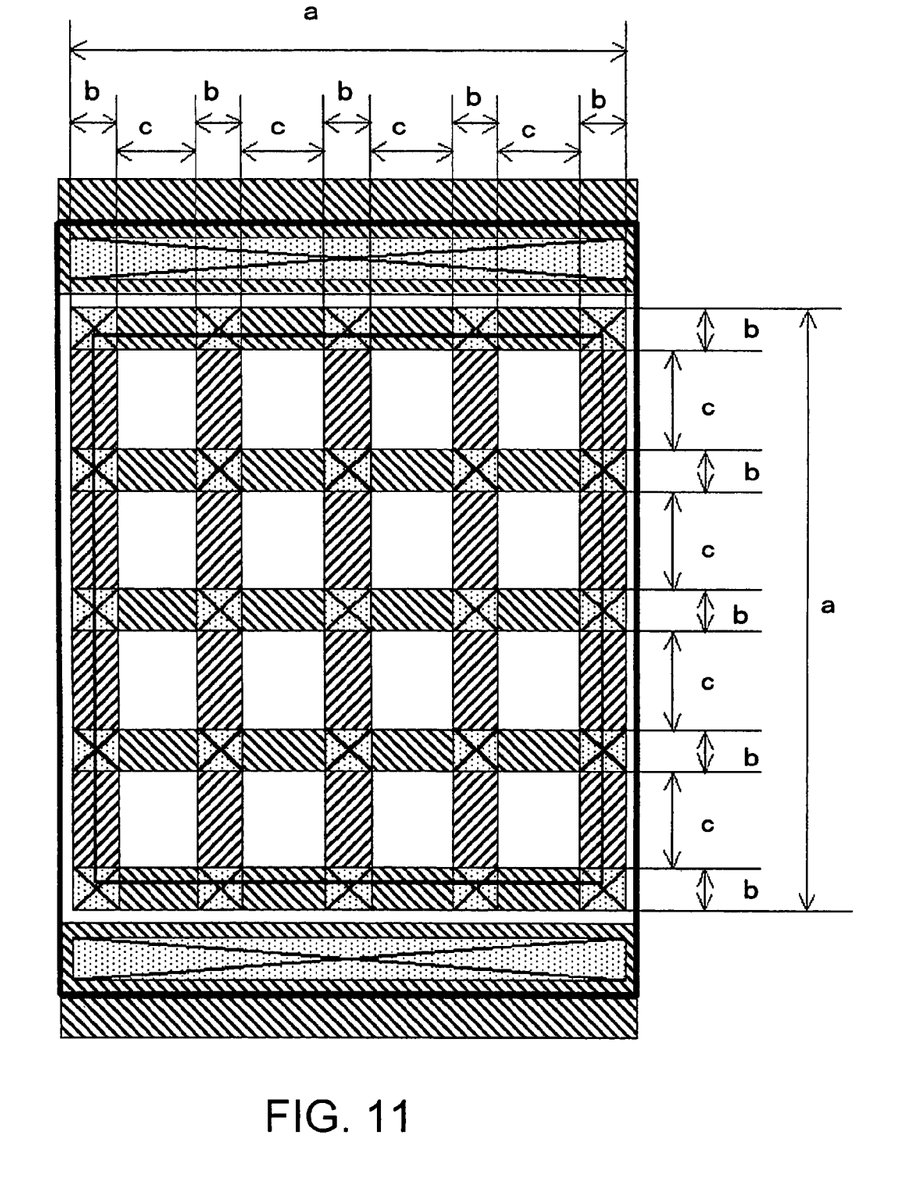
FIG. 11 is a view for describing dimensions of wires in the bonding pad.

The size and the various standards of the bonding pad are slightly different depending upon the type of a package and the performance of the bonding apparatus. Referring to FIG. 11, description will be made of the dimensions of the bonding pad in connection with the case where a typical bonding apparatus for a TSOP (Thin Small Outline Package) package is used. The #1 aluminum plug wires and the #2 aluminum plug wires have an outer shape having one side (a) equal to 85 µm. Each of the #2 and the #1 aluminum plug wires has a pattern width (b) equal to 5 µm. Then, an interval (c) between every two adjacent ones of the aluminum plug wires is equal to 15 µm. Therefore, one region allowing the pass-through wires in the lower layer to pass through has a size of 15 µm. In this region of 15 µm, 13 pass-through wires are allowed to pass through if each pass-through wire has a width of 0.5 µm, the interval is 0.5 µm, and the pitch is 1 µm. Therefore, in the bonding pad region as a whole, 52 (13×4) pass-through wires are allowed to pass through.

Figure 6:
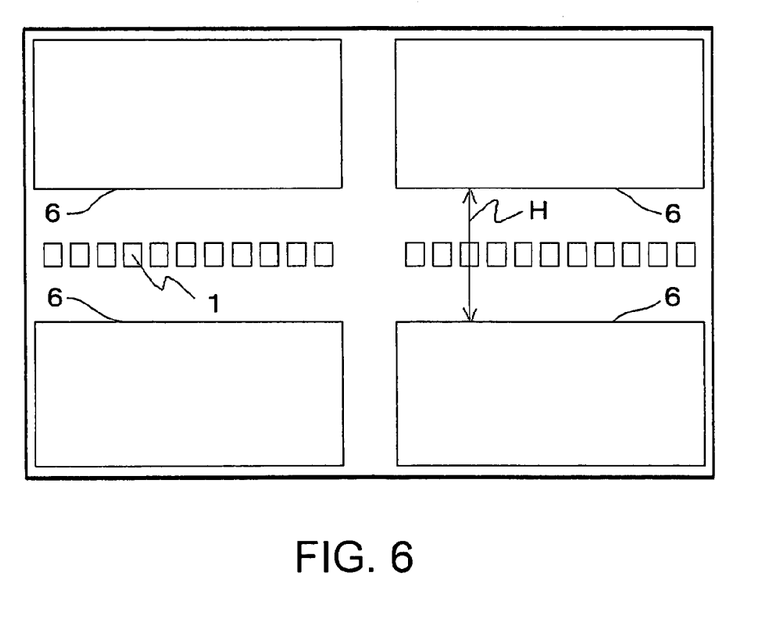
FIG. 6 is a layout view of a semiconductor chip.

In the chip illustrated in FIG. 6, the layout width (H) around the bonding pad is determined by the limit number of the signal lines extending in the longitudinal direction of the chip. In this case, 52 signal lines to be generally extended in the signal line region except the bonding pad region are allowed to pass through the bonding pad region. Therefore, the layout width (H) can be reduced by about 52 µm at maximum. In FIG. 11, the power supply lines are allowed to pass through the region of the interval (c) between the aluminum plug wires. In this event, assuming that an interval margin of 1 µm is secured on opposite sides of each region of 15 µm, the power supply line of 13 µm wide is allowed to pass through. In one bonding pad region as a whole, 4 power supply lines each having a width of 13 µm are allowed to pass through. Therefore, the layout width (H) can be reduced by about 52 µm at maximum.

By forming the plug wires in the bonding pad region, the pattern rate of the #1 aluminum and the #2 aluminum layers can be optimized. In case where 5 plug wires each having a width of 5 µm are arranged in the region of 85 µm, the pattern rate is about 30%. If 13 wires each having a width of 0.5 µm are arranged between the plug wires, the pattern rate is about 37%. In case where 52 wires as the maximum number are arranged, the pattern rate is about 60%. At such pattern rate, excellent etching and CMP conditions can be obtained so that a fine pattern can be formed. Therefore, a fine pattern can be used as the aluminum pass-through wires.

Generally, the pattern rate at which the excellent etching and CMP conditions are obtained is 20% to 60%, more preferably, 40% to 50%. Therefore, a plug wiring pattern is determined so that the pattern rate is not smaller than the minimum pattern rate. For example, it is assumed that the bonding pad has one side of 100 µm and the plug wires are stripe lines, five in number, each having a width of 4 µm. Then, the pattern rate is 20%. Thus, the minimum pattern rate is assured by the striped plug wiring pattern. Further, the pass-through wires each having a width of 0.5 µm are arranged at a pitch of 1 µm. In this case, 78 pass-through wires can be arranged at maximum. If the maximum number of the pass-through wires are arranged, the pattern rate is 59% (5×4 µm for the plug wires and 0.5×78 µm for the pass-through wires). Thus, the minimum pattern rate is assured by the plug wiring pattern and the pattern rate approaches that of the internal circuit region by presence of the pass-through wires. By making the pattern rate be nearer to that of the internal circuit region, the pass-through wires can be finer.

Figure 12:
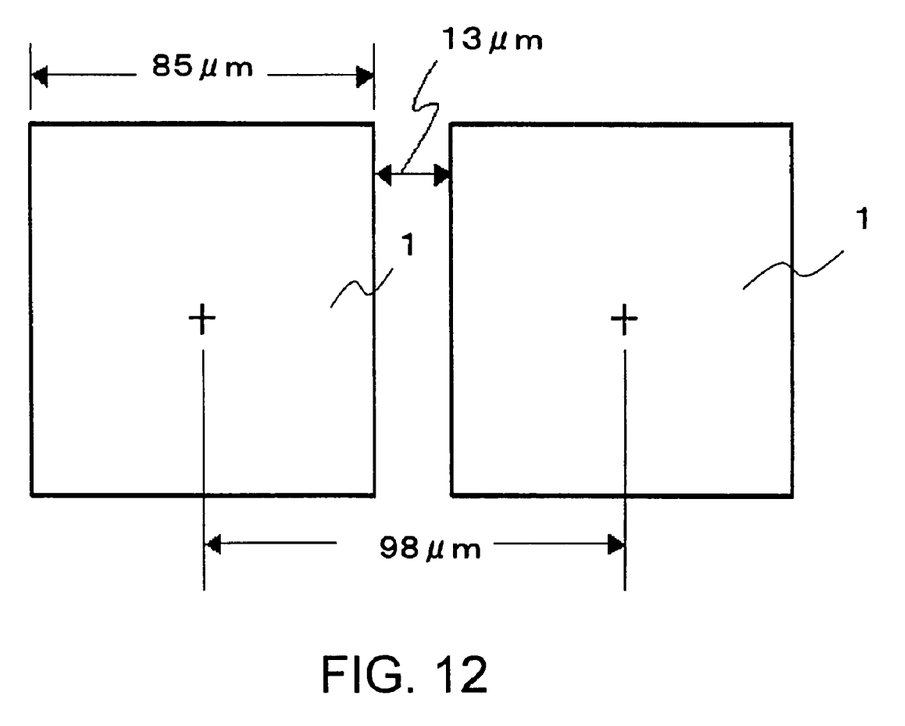
FIG. 12 is a view showing dimensions between the bonding pads.

Referring to FIG. 12, in case where a plurality of pads are arranged adjacent to one another, the pitch of the pads is about 98 µm at minimum. The pad size is 85 µm and a space of 13 µm is left between two adjacent pads. Traditionally, by the use of this space, signal lines can be laid between upside and downside of the layout on opposite sides of the bonding pad region. However, if a number of wires or a thick power supply line must be laid and the space of 13 µm is insufficient, the pitch between the two adjacent pads must be widened. This results in an increase in chip size in the longitudinal direction.

According to this invention, the signal lines between upside and downside of the layout on opposite sides of the pad region can be extended in the region under the bonding pad as shown in FIG. 9. Therefore, without widening the pitch between two adjacent pads, a number of wires or a thick power supply line can be laid. This is effective in reducing the chip size in the longitudinal direction. As shown in FIG. 10, it is possible to connect, by the conductive plugs, the vertical and the horizontal pass-through wires in the region under the bonding pad. Thus, the signal lines can be freely laid even if the signal lines pass through the region under the bonding pad.

In this embodiment, the plug wires are arranged under the bonding pad and connected to the pad wires by the conductive plugs. By the use of a hard material as the conductive plugs, a mechanical shock during bonding is absorbed by the conductive plugs. With this structure, it is possible to prevent peeling of the bonding pad and breakage of the pass-through wires under the bonding pad due to the mechanical shock during bonding. The plug wiring pattern is determined so as to achieve the pattern rate not smaller than the minimum pattern rate. By maintaining the minimum pattern rate by the plug wiring pattern and making the pattern rate be nearer to that of the internal circuit region, the pass-through wires can be finer.

Second Embodiment

Referring to FIGS. 13 to 16, description will be made of a second embodiment of this invention. In this embodiment, the pass-through wires are laid in the same direction. Like in the first embodiment, a three-layer aluminum product will be described by way of example.

Figure 13:
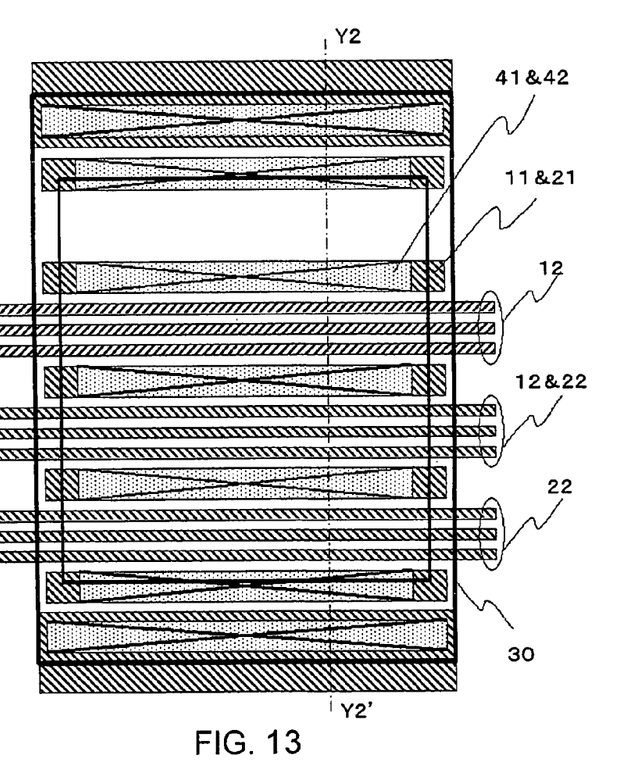
FIG. 13 is a plan view of a bonding pad according to a second embodiment of this invention in which #2 aluminum wires and #1 aluminum wires are arranged in parallel.
Figure 14:
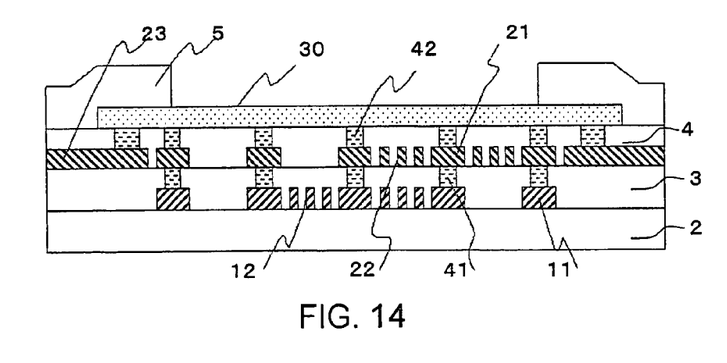
FIG. 14 is a sectional view taken along a line 14-14 in FIG. 13.

As shown in FIGS. 13 and 14, #1 aluminum plug wires 11, #1 aluminum pass-through wires 12, #2 aluminum plug wires 21, and #2 aluminum pass-through wires 22 are arranged to extend in the X direction in the figures. #2 aluminum pad connection wires 23, a #3 aluminum pad wire 30, interlayer insulating films 2, 3, and 4, and polyimide 5 are similar to those in the first embodiment. Therefore, each of #1-#2 layer conductive plugs 41 and #2-#3 layer conductive plugs 42 is formed in a rectangular shape along the respective plug wires. This embodiment is applied in case where a large number of signal wires are arranged in the X direction in the DRAM illustrated in FIG. 6.

Figure 15:
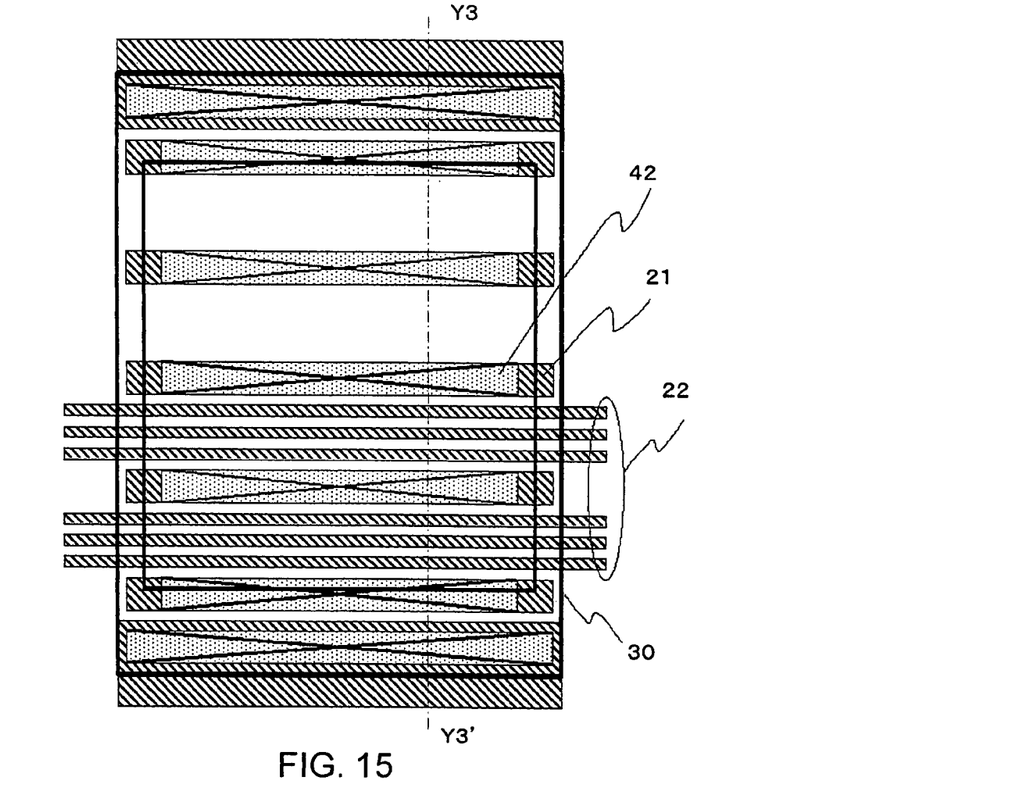
FIG. 15 is a plan view of a modification of the bonding pad in the second embodiment without the #1 aluminum wires.
Figure 16:
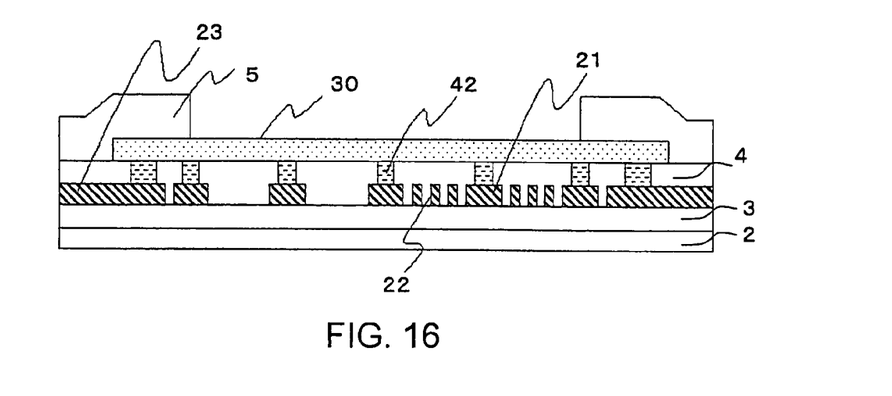
FIG. 16 is a sectional view taken along a line 16-16 in FIG. 15.

Referring to FIGS. 15 and 16, a #2 aluminum pattern as a single wiring layer is arranged in a region under a bonding pad without a #1 aluminum pattern. As compared with the example illustrated in FIGS. 13 and 14, the #1 aluminum plug wires 11, the #1 aluminum pass-through wires 12, the #1-#2 layer conductive plugs 21 are omitted. The remaining parts are similar to those in FIGS. 13 and 14 and will not be described. Thus, the #1 aluminum and the #2 aluminum wires are freely arranged without limitation.

In this embodiment also, the plug wires are arranged under the bonding pad and connected to the pad wires by the conductive plugs. By the use of a hard material as the conductive plugs, a mechanical shock during bonding is absorbed by the conductive plugs. With this structure, it is possible to prevent peeling of the bonding pad and breakage of the pass-through wires under the bonding pad due to the mechanical shock during bonding. The plug wiring pattern is determined so as to achieve the pattern rate not smaller than the minimum pattern rate. By maintaining the minimum pattern rate by the plug wiring pattern and making the pattern rate be nearer to that of the internal circuit region, the pass-through wires can be finer.

While the present invention has thus far been described in connection with the preferred embodiments thereof, the present invention is not limited thereto. It will readily be possible for those skilled in the art to put this invention into practice in various other manners within the scope of the present invention.

What is claimed is:

1. A semiconductor apparatus, comprising:
   a multilevel wiring structure including an uppermost-level wiring layer, a first lower-level wiring layer that is below and next to the uppermost-level wiring layer, and a first interlayer insulating film intervening between the uppermost-level wiring layer and the first lower-level wiring layer, wherein the uppermost-level wiring layer includes a bonding pad and the first lower-level wiring layer includes a first plug wire;
   a plurality of first conductive plugs each formed in the first interlayer insulating film to connect the bonding pad to the first plug wire,
   wherein the first lower-level wiring layer further comprises a plurality of second plug wires, where the first plug wire and the second plug wires are spaced apart from each other, and a plurality of second conductive plugs each formed in the first interlayer insulating film to connect the bonding pad to a corresponding one of the second plug wires; and
   at least one first pass-through wire formed as the first lower-level wiring layer, the first pass-through wire running between adjacent ones of the first and second plug wires in isolation from each of the first and second plug wires and the bonding pad by the first interlayer insulating film.

2. The apparatus as claimed in claim 1, wherein the first and second plug wires are in substantially parallel to one another.

3. The apparatus as claimed in claim 1, wherein the first and second plug wires and the first pass-through wire are in substantially parallel to one another.

4. The apparatus as claimed in claim 1, wherein the multilevel wiring structure further includes a second lower-level wiring layer below and next to the first lower-level wiring layer and a second interlayer insulating film intervening between the first and second lower-level wiring layers,
   wherein the second lower-level wiring layer includes a third plug wire, and a plurality of third conductive plugs each formed in the second interlayer insulating film to connect the first plug wire to the third plug wire.

5. The apparatus as claimed in claim 4, wherein the first lower-level wiring layer further includes:
   a plurality of second plug wires, wherein the first plug wire and the second plug wires are spaced apart from one another; and
   a plurality of second conductive plugs each formed in the first interlayer insulating film to connect the bonding pad to a corresponding one of the second plug wires, and
   wherein the second lower-level wiring layer further includes:
   a plurality of fourth plug wires, wherein the third plug wire and the fourth plug wires are spaced apart from one another; and
   a plurality of fourth conductive plugs each formed in the second interlayer insulating film to connect each of the second plug wires to a corresponding one of the fourth plug wires.

6. The apparatus as claimed in claim 4, wherein the first plug wire is elongated in a first direction and the third plug wire is elongated in a second direction that is substantially perpendicular to the first direction.

7. The apparatus as claimed in claim 5, wherein the first and second plug wires are elongated in parallel to one another in a first direction and the third and fourth plug wires are elongated in parallel to one another in a second direction that is substantially perpendicular to the first direction.

8. A semiconductor apparatus, comprising:
   a multilevel wiring structure including an uppermost-level wiring layer, a first lower-level wiring layer that is below and next to the uppermost-level wiring layer, and a first interlayer insulating film intervening between the uppermost-level wiring layer and the first lower-level wiring layer,
   wherein the uppermost-level wiring layer includes a bonding pad and the first lower-level wiring layer includes a first plug wire; and
   a plurality of first conductive plugs each formed in the first interlayer insulating film to connect the bonding pad to the first plug wire,
   wherein the multilevel wiring structure further includes a second lower-level wiring layer below and next to the first lower-level wiring layer and a second interlayer insulating film intervening between the first and second lower-level wiring layers,
   wherein the second lower-level wiring layer includes a third plug wire, and a plurality of third conductive plugs each formed in the second interlayer insulating film to connect the first plug wire to the third plug wire,
   wherein the first lower-level wiring layer further includes:
   a plurality of second plug wires, wherein the first plug wire and the second plug wires are spaced apart from one another; and
   a plurality of second conductive plugs each formed in the first interlayer insulating film to connect the bonding pad to a corresponding one of the second plug wires, and
   wherein the second lower-level wiring layer further includes:
   a plurality of fourth plug wires, wherein the third plug wire and the fourth plug wires are spaced apart from one another; and
   a plurality of fourth conductive plugs each formed in the second interlayer insulating film to connect each of the second plug wires to a corresponding one of the fourth plug wires, wherein the second lower-level wiring layer further includes at least one second pass-through wire between adjacent ones of the third plug wire and the fourth plug wires and isolated from the first plug wire, the second plug wires, the third plug wire and the fourth plug wires by the second interlayer insulating film.

9. The apparatus as claimed in claim 1, wherein the multi-level wiring structure further includes:
a second lower-level wiring layer below and next to the first lower-level wiring layer; and
a second interlayer insulating film intervening between the first and second lower-level wiring layers, wherein the second lower-level wiring layer includes:
a plurality of third plug wires spaced apart from one another; and
a plurality of third conductive plugs each formed in the second interlayer insulating film to connect each of the first plug wire and the second plug wires to a corresponding one of the third plug wires, and
wherein at least one second pass-through wire is between adjacent ones of the third plug wires and isolated from the first plug wire, the second plug wires and the third plug wires by the second interlayer insulating film.

10. The apparatus as claimed in claim 9, wherein the first and second plug wires and the first pass-through wire are elongated in parallel to one another in a first direction and the third plug wires and the second pass-through wire are elongated in parallel to one another in a second direction that is substantially perpendicular to the first direction.

11. A semiconductor apparatus, comprising:
a plurality of first plug wires arranged with space between adjacent ones of the first plug wires;
a first insulating layer formed over the first plug wires;
a bonding pad formed on the first insulating layer to cover the first plug wires;
a plurality of sets of first conductive plugs, each set being formed in the first insulating layer to connect the bonding pad to an associated one of the first plug wires, each of the first plug wires being thereby connected to the bonding pad through an associated set of the first conductive plugs;
at least one first pass-through wire running between adjacent ones of the first plug wires in isolation from each of the first plug wires and the bonding pad by the first insulating layer;
a plurality of second plug wires arranged to make a space between adjacent ones of the second plug wires;
a second insulating layer formed over the second plug wires, the first plug wires being formed on the second insulating layer;
a plurality of sets of second conductive plugs each set formed in the second insulating layer to connect an associated one of the first plug wires to an associated one of the second plug wires, each of the first plug wires being thereby connected to the associated one of the second plug wires through an associated set of the second conductive plugs; and
at least one second pass-through wire running between adjacent ones of the second plug wires in isolation from each of the second plug wires.

12. The apparatus as claimed in claim 11, wherein the first plug wires and the first pass-through wire are elongated in parallel to one another.

13. The apparatus as claimed in claim 11, wherein the first plug wires and the first pass-through wire are elongated in parallel to one another in a first direction and the second plug wires and the second pass-through wire are elongated in parallel to one another in a second direction that is substantially perpendicular to the first direction.

* * * * *

UNITED STATES PATENT AND TRADEMARK OFFICE
CERTIFICATE OF CORRECTION

PATENT NO.           : 7,884,478 B2
APPLICATION NO.      : 11/710486
DATED                : February 8, 2011
INVENTOR(S)          : Shoji Azuma It is certified that error appears in the above-identified patent and that said Letters Patent is hereby corrected as shown below:

In the Claims

In claim 5, delete all text beginning with "wherein the first" in column 10, line 3 and continuing through and including "to a corresponding one of the second plug wires, and" in column 10, line 10.

Signed and Sealed this
Eleventh Day of August, 2015

Michelle K. Lee
*Director of the United States Patent and Trademark Office*